United States Patent

Komiya et al.

[11] Patent Number: 5,710,737
[45] Date of Patent: Jan. 20, 1998

[54] SEMICONDUCTOR MEMORY DEVICE

[75] Inventors: Yuichiro Komiya; Kiyohiro Furutani; Tsukasa Ooishi; Kei Hamade, all of Tokyo, Japan

[73] Assignee: Mitsubishi Denki Kabushiki Kaisha, Tokyo, Japan

[21] Appl. No.: 652,035

[22] Filed: May 23, 1996

[30] Foreign Application Priority Data

Nov. 28, 1995 [JP] Japan ................. 7-309608

[51] Int. Cl.[6] ............... G11C 7/00; G11C 29/00
[52] U.S. Cl. ............................... 365/201; 365/193
[58] Field of Search ....................... 365/201, 193, 365/189.07; 371/21.1

[56] References Cited

U.S. PATENT DOCUMENTS 5,381,373  1/1995  Ohsawa ................. 365/201
5,471,429  11/1995 Lee et al. ............... 365/201

FOREIGN PATENT DOCUMENTS 59-28986  7/1984  Japan.

Primary Examiner—Joseph A. Popek
Attorney, Agent, or Firm—Lowe, Price, LeBlanc & Becker

[57] ABSTRACT

A sense amplifier (2) is connected to an input/output circuit (7), transmitting input/output data therebetween. The input/output circuit (7) is connected to an address scramble circuit (8). Furthermore, the input/output circuit (7) is connected to a data input/output terminal (DIO), externally transmitting data. The address scramble circuit (8) receives input data (INTDQ) from the data input/output terminal (DIO) and converts the input data (INTDQ) into write data (WD) in accordance with the layout of memory cells in a memory array (1) in response to a burn-in mode signal (BIT) outputted from an address key circuit (9) and a row address first signal RAF outputted from a row address buffer (6). Having the above configuration, a semiconductor memory device can be provided, which permits a prescribed stress to be imposed on its internal circuit only by inputting simple data even in a burn-in test. Moreover, a semiconductor memory device can be provided, which allows an external verification as to whether the device itself enters a burn-in mode or not.

10 Claims, 8 Drawing Sheets

| RA2 | RA1 | RA0 | WL |
|---|---|---|---|
| 0 | 0 | 0 | 0 |
| 0 | 0 | 1 | 1 |
| 0 | 1 | 1 | 3 |
| 0 | 1 | 0 | 2 |
| 1 | 0 | 0 | 4 |
| 1 | 0 | 1 | 5 |
| 1 | 1 | 1 | 7 |
| 1 | 1 | 0 | 6 |

FIG. 10A $\overline{RAS}$

FIG. 10B $\overline{CAS}$

FIG. 10C $\overline{WE}$

FIG. 10F BIT

SEMICONDUCTOR MEMORY DEVICE

BACKGROUND OF THE INVENTION

1. Field of the Invention

The present invention relates to a semiconductor memory device, and more particularly to a semiconductor memory device which prevents various drawbacks in a burn-in test and allows an external verification as to whether the burn-in test is properly performed or not.

2. Description of the Background Art

Semiconductor devices including semiconductor memory devices are subject to a variety of tests after manufactured. One of the tests is a burn-in test.

The burn-in test is performed under unusual conditions that increase a stress on an internal circuit, such as higher operating source voltage, higher or lower cell plate potential and externally-set higher temperature than usual, to verify reliability of a semiconductor device.

In a DRAM (dynamic RAM), generally, logic addresses specified by address terminals and the physical layout of cells on a chip do not necessarily correspond to each other. This is termed "address scramble", which mainly results from size constraint of the chip.

Figure 13:
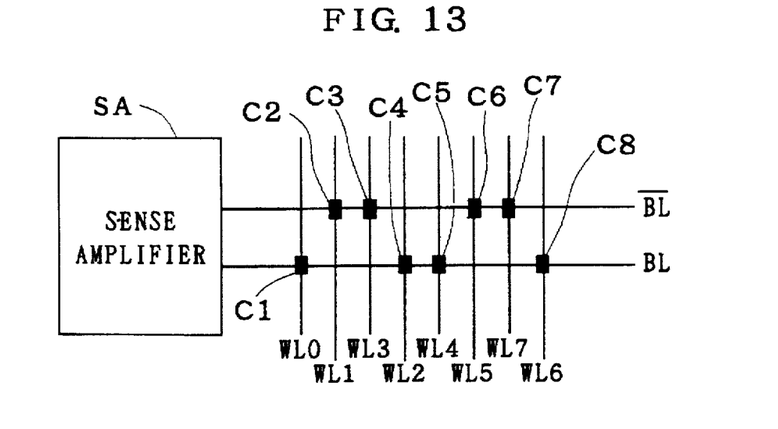
FIG. 13 is a diagram of a configuration of a memory array.

FIG. 13 is a conceptional diagram of an exemplary layout of memory cells in the DRAM. This figure shows an arrangement where bit lines BL and $\overline{BL}$ are connected in parallel to a sense amplifier SA, being orthogonal to word lines WL0 to WL7. The word lines are aligned from the sense amplifier SA in the order of WL0, WL1, WL3, WL2, WL4, WL5, WL7 and WL6, not in the order of number.

A memory cell C1 is provided at an intersection of the bit line BL and the word line WL0. A memory cell C2 is provided at an intersection of the bit line $\overline{BL}$ and the word line WL1. A memory cell C3 is provided at an intersection of the bit line $\overline{BL}$ and the word line WL3. A memory cell C4 is provided at an intersection of the bit line BL and the word line WL2. A memory cell C5 is provided at an intersection of the bit line BL and the word line WL4. A memory cell C6 is provided at an intersection of the bit line $\overline{BL}$ and the word line WL5. A memory cell C7 is provided at an intersection of the bit line $\overline{BL}$ and the word line WL7. A memory cell C8 is provided at an intersection of the bit line BL and the word line WL6.

The memory cells connected to the bit line $\overline{BL}$ are loaded with inverted input data. Accordingly, the input data and the inverted input data are written into the memory cells C1 to C8 in a two-by-two alternate pattern.

The burn-in test needs a greater stress to be imposed on the internal circuit, and accordingly it is desirable that all capacitors of the memory cells should be of either high potential or low potential, in other words, all of the memory cells should be loaded with either "H" (High) or "L" (LOW).

In some cases of tests other than the burn-in test, all of the memory cells should be loaded with either "H" or "L". These tests are, however, performed by using a tester having an address scramble conversion device, and in a case of input data of all "H", the address scramble conversion device automatically converts the input data so that "H" may be written into all of the memory cells, including the memory cells connected to the bit line $\overline{BL}$. Therefore, it is not necessary to input various data from memory cell to memory cell.

The burn-in test is performed by using a simple tester which is not provided with the address scramble conversion device since the test is performed under high temperature conditions and so on. That necessitates inputting data of complicate pattern, specifically, various data from memory cell to memory cell.

On the other hand, performing a simultaneous and parallel burn-in test for a plurality of semiconductor memory devices causes heavy load and the input data of complicate pattern have dull signal waveforms, which hinders an accurate data input operation.

Furthermore, unlike other tests, even when the semiconductor memory device is not brought into a burn-in mode, the burn-in test seems to normally proceed. If the semiconductor memory device is not in the burn-in mode during the burn-in test, the internal circuit is tested without a prescribed stress thereon, and as a result, there may arise a case of missing defective items. Therefore, it is very important to verify whether the semiconductor memory device under test is brought into the burn-in mode or not.

The background-art semiconductor memory device, however, does not allow that verification.

Having the above configuration, the background-art semiconductor memory device has the necessity of inputting data of complicate pattern, specifically, various data from memory cell to memory cell. That makes the data input operation troublesome, and the input data of complicate pattern have dull signal waveforms which disadvantageously hinders an accurate data input operation.

Furthermore, the background-art semiconductor memory device does not allow verification as to whether the device itself is brought into the burn-in mode or not during the burn-in test.

SUMMARY OF THE INVENTION

The present invention is directed to a semiconductor memory device. According to a first aspect of the present invention, the semiconductor memory device comprises: input means for supplying a first bit line with a first signal of a first potential which is the equivalent of a potential of input data and supplying a second bit line with a second signal of a second potential which is the reverse of the potential of the input data; a first memory cell provided on an intersection of the first bit line and a word line of a first type which is a word line assigned either odd number or even number; and a second memory cell provided on an intersection of the second bit line and a word line of a second type opposite to the first type, wherein the first signal is written into the first memory cell when the first bit line and the word line of the first type are selected and the second signal is written into the second memory cell when the second bit line and the word line of the second type are selected, and further the semiconductor memory device comprises: burn-in mode signal output means for outputting a burn-in mode signal which is brought into an active state when a burn-in test is performed; and input data inverting means provided in an ante-stage of the input means to receive the burn-in mode signal, for automatically inverting the input data when the word line of the second type is selected while the burn-in mode signal is active.

According to a second aspect of the present invention, in the semiconductor memory device of the first aspect, the input data inverting means includes inversion instructing means for receiving the burn-in mode signal and a row address signal which is applied to a prescribed row address terminal and brought into an active state when the word line of the second type is selected and outputting an inversion instructing signal which is brought into an active state when the burn-in mode signal and the row address signal become active; and signal inverting means for receiving the inversion instructing signal and the input data and inverting the input data which are inputted while the inversion instructing signal is active, to output inverted input data.

According to a third aspect of the present invention, in the semiconductor memory device of the second aspect, the inversion instructing means includes a first NAND circuit for receiving the burn-in mode signal and the row address signal; and a first inverter circuit for receiving an output from the first NAND circuit and inverting the output to output it, and the signal inverting means includes a second inverter circuit for receiving the input data; a third inverter circuit connected in series to the second inverter circuit; a fourth inverter circuit for receiving the inversion instructing signal; a first AND circuit for receiving outputs from the third and fourth inverter circuits; a second AND circuit for receiving an output from the second inverter circuit and the input data; a NOR circuit for receiving outputs of the first and second AND circuits; and a fifth inverter circuit for inverting an output of the NOR circuit to output it.

According to a fourth aspect of the present invention, the semiconductor memory device of the first aspect further comprises: cell-plate potential switching means for receiving the burn-in mode signal and switching cell plate potentials of the first and second memory cells to the second potential while the burn-in mode signal is active.

The present invention is also directed to another semiconductor memory device. According to a fifth aspect of the present invention, the semiconductor memory device comprises: burn-in mode signal output means for outputting a burn-in mode signal which is brought into an active state in response to a column address strobe signal, a row address strobe signal, a write enable signal and a plurality of address signals inputted from a plurality of address terminals, all of which are supplied at a prescribed timing during a burn-in test, and a source voltage of higher level than a level of a normal high-potential signal which is applied to specific address terminal different from the plurality of address terminals; and burn-in mode verifying means provided between the specific address terminal and a ground potential, for verifying if the semiconductor memory device enters a burn-in mode and notifying the verification result by carrying a leak current between the specific address terminal and the ground potential in response to the burn-in mode signal which is active.

According to a sixth aspect of the present invention, in the semiconductor memory device of the fifth aspect, the burn-in mode verifying means includes a first transistor having an electrode which is connected to the specific address terminal and also connected to its own control electrode to establish a diode connection; a plurality of second transistors each establishing a diode connection and connected in series to the first transistor; and a third transistor interposed between the last one of the second transistors and the ground potential, having a control electrode connected to the burn-in mode signal output means.

According to a seventh aspect of the present invention, in the semiconductor memory device of the sixth aspect, the plurality of second transistors each include short-circuit means provided in parallel between one electrode and the other electrode thereof, for establishing a short-circuit connection between the one electrode and the other electrode under a prescribed condition.

According to an eighth aspect of the present invention, in the semiconductor memory device of the fifth aspect, the burn-in mode signal output means includes source voltage detecting means for detecting whether the source voltage of higher level than the level of the normal high-potential signal is applied or not and outputting a voltage detection signal which is brought into an active state when the source voltage of higher level than the level of the normal high-potential signal is applied; WCBR detecting means for outputting a WCBR detection signal which is brought into an active state when the row address strobe signal falls after the write enable signal and the column address strobe signal fall; and mode selecting means for rendering the burn-in mode signal active or non-active depending on a combination of the plurality of address signals, the voltage detection signal and WCBR detection signal.

In the semiconductor memory device according to the first aspect of the present invention, the input data inverting means automatically inverts the input data when the word line of the second type is selected while the burn-in mode signal is active. Therefore, the second memory cell can be loaded with the first signal if all the input data are of the first potential, and there is no need to provide the different input data for the second memory cell. That renders the data input operation simple, and consequently reduces time and effort for the burn-in test. Furthermore, the simplified input data have less dull input waveforms, leading to an accurate data input operation, even if heavy load is caused by a parallel connection of a plurality of semiconductor memory devices under test.

In the semiconductor memory device according to the second aspect of the present invention, the inversion instructing means outputs the inversion instructing signal which is brought into the active state when both the burn-in mode signal and the row address signal become active, and the signal inverting means, receiving the inversion instructing signal, inverts the input data which are inputted while the inversion instructing signal is active. Thus, automatic inversion of the input data can be achieved when the word line of the second type is selected.

In the semiconductor memory device according to the third aspect of the present invention, when both the burn-in mode signal and the row address signal are brought into "H", i.e., an active state, the output of the first NAND circuit becomes "L" and the output of the first inverter circuit, i.e., the inversion instructing signal, becomes "H". When the inversion instructing signal is "H" and the input data are "H", the output of the NOR circuit becomes "H" and then inverted into "L" by the fifth inverter circuit, and on the other hand, when the inversion instructing signal is "H" and the input data are "L", the output of the NOR circuit becomes "L" and then inverted into "H" by the fifth inverter circuit. Thus, the semiconductor memory device can be provided, which is suitable for automatic inversion of the input data on the selection of the word line of the second type.

In the semiconductor memory device according to the fourth aspect of the present invention, the cell-plate potential switching means switches cell plate potentials of the first and second memory cells to the second potential while the burn-in mode signal is active, thereby increasing a stress on the memory cells and ensuring more reliable burn-in test.

In the semiconductor memory device according to the fifth aspect of the present invention, the burn-in mode signal output means generates the burn-in mode signal which is brought into the active state in response to the column address strobe signal, the row address strobe signal, the write enable signal and a plurality of address signals, all of which are supplied at a prescribed timing, and a source voltage of higher level than the level of the normal high-potential signal. Therefore, a leak current starts flowing at the point of time when the address signals are applied to the address terminals, so that power consumption for verification of the burn-in mode is reduced. Furthermore, given the burn-in mode signal, the burn-in mode verifying means verifies if the device enters the burn-in mode and notify the verification result by carrying the leak current. Thus, whether or not the test is performed in the burn-in mode is externally verified to thereby eliminate the possibility of missing the defective items which would arise if the test is performed out of the burn-in mode.

In the semiconductor memory device according to the sixth aspect of the present invention, the leak current flows between the specific address terminal and the ground potential when the specific address terminal is supplied with a voltage which excesses the total of dropped voltages across the first transistor and a plurality of second transistors and the control gate of the third transistor is supplied with the active burn-in mode signal. Thus, the semiconductor memory device can be achieved, which allows the external verification as to whether the device itself enters the burn-in mode or not.

In the semiconductor memory device according to the seventh aspect of the present invention, the second transistors each include the short-circuit means, and in any of the second transistors of which threshold value is out of the design, the short-circuit means establishes a short-circuit connection between one electrode and the other electrode. With that short-circuit means, it is possible to avoid a case where no leak current flows though the burn-in mode signal is active.

In the semiconductor memory device according to the eighth aspect of the present invention, the burn-in mode signal output means includes the source voltage detecting means, the WCBR detecting means for detecting whether the device is in a WCBR state and the mode selecting means. The semiconductor memory device of the eighth aspect enters the test mode through the WCBR state and selects the burn-in mode by inputting the address signals from a plurality of address input terminals, and therefore it allows a reliable burn-in test.

An object of the present invention is to provide a semiconductor memory device which allows a prescribed stress to be imposed on its internal circuit only by inputting simple data during the burn-in test, and further provide a semiconductor memory device which allows the external verification as to whether or not the device itself is brought into the burn-in mode during the burn-in test.

These and other objects, features, aspects and advantages of the present invention will become more apparent from the following detailed description of the present invention when taken in conjunction with the accompanying drawings.

DESCRIPTION OF THE PREFERRED EMBODIMENTS

A. The First Preferred Embodiment

A-1. Configuration of Semiconductor Memory Device

Figure 1:
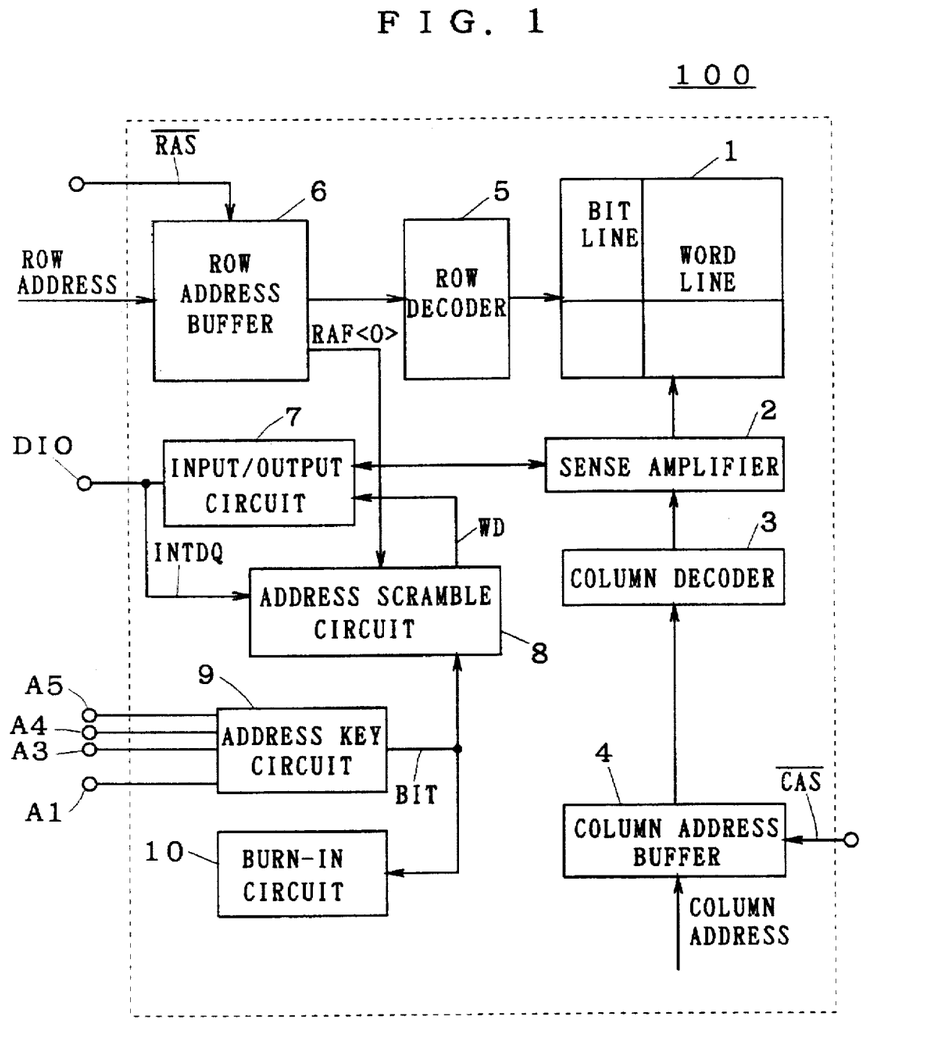
FIG. 1 is a block diagram of a configuration of a semiconductor memory device in accordance with a first preferred embodiment of the present invention.

FIG. 1 is a block diagram of a configuration of a semiconductor memory device 100 in accordance with the first preferred embodiment of the present invention. In this figure, a memory array 1 has bit lines connected to a sense amplifier 2, and the sense amplifier 2 is supplied with a column address through a column address buffer 4 and a column decoder 3. The memory array 1 further has word lines connected to a row decoder 5, and the row decoder 5 is supplied with a row address through a row address buffer 6. Furthermore, the column address buffer 4 is supplied with a column address strobe signal $\overline{CAS}$ and the row address buffer 6 is supplied with a row address strobe signal $\overline{RAS}$.

The sense amplifier 2 is connected to an input/output circuit 7, transmitting input data and output data therebetween. The input/output circuit 7 is connected to an address scramble circuit 8. Furthermore, the input/output circuit 7 is connected to a data input/output terminal DIO, externally transmitting data.

The address scramble circuit 8 receives input data INTDQ applied to the data input/output terminal DIO and converts the input data into write data WD in accordance with the layout of cells in the memory array 1. An operation of the address scramble circuit 8 is responsive to a burn-in mode signal BIT outputted from an address key circuit 9 and a row address first signal RAF from the row address buffer 6. The burn-in mode signal BIT gives an instruction for changing an environment in an internal circuit to perform a burn-in test, and the row address first signal RAF is an address signal which has been already latched into the row address buffer 6 and has not been yet supplied to the row decoder 5. Furthermore, a configuration of the address key circuit 9 will be discussed later.

The burn-in mode signal BIT is also applied to a burn-in circuit 10. The burn-in circuit 10 receives the burn-in mode signal BIT, and changes the state of an operating source voltage and a cell plate potential from a normal mode to a burn-in test mode.

A-2. Configuration of Address Scramble Circuit

Figure 2:
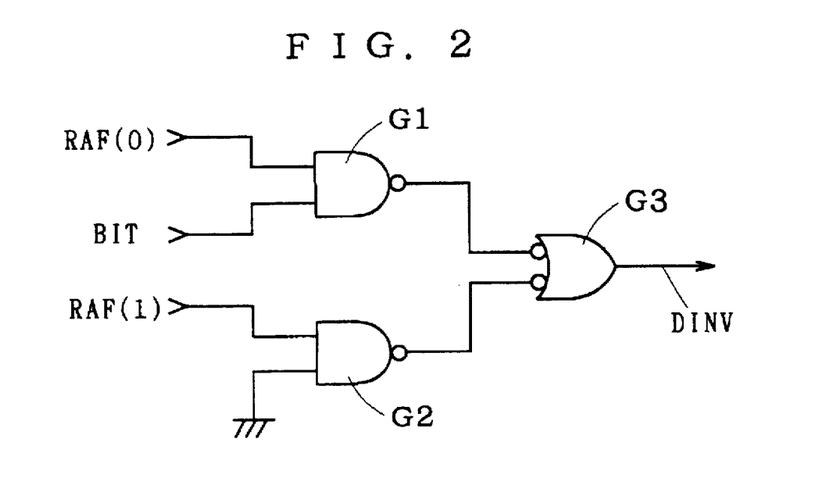
FIGS. 2 and 3 are diagrams of a configuration of an address scramble circuit in accordance with the first preferred embodiment of the present invention.
Figure 3:
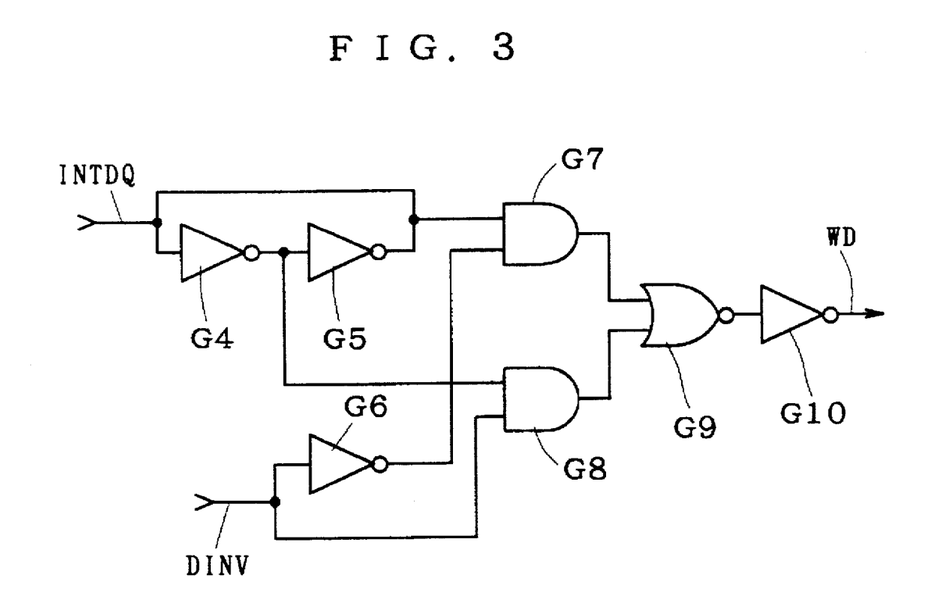

FIG. 2 shows an ante-stage configuration of the address scramble circuit 8 and FIG. 3 shows a post-stage configuration thereof. In FIG. 2, the outputs of NAND circuits G1 and G2 are connected to the inputs of a negative input NAND circuit G3. The inputs of the NAND circuit G1 are supplied with the 0-th row address first signal RAF (0) and the burn-in mode signal BIT, and one of the inputs of the NAND circuit G2 is supplied with the 1-th row address first signal RAF (1) and the other input thereof is connected to a ground potential, being always "L". The negative NAND circuit G3 outputs a data inversion instructing signal DINV. Thus, the ante-stage circuit serves as an inversion instructing circuit which instructs data inversion.

Furthermore, since the input of the NAND circuit G2 of FIG. 2 is connected to the ground potential, the output thereof is always "H" regardless of the 1-th row address first signal RAF (1).

If only the inversion of the output of the NAND circuit G1 is required, there may be a configuration where neither the NAND circuit G2 nor the negative NAND circuit G3 is provided, and the output of the NAND circuit G1 is connected to an inverter circuit.

In FIG. 3 showing the post-stage configuration, the input data INTDQ are inputted to an inverter circuit G4, the output of the inverter circuit G4 is connected to both the input of the inverter circuit G5 and the input of an AND circuit G8. The output of the inverter circuit G5 is connected to the input of an AND circuit G7.

The data inversion instructing signal DINV which is the output from the ante-stage circuit is supplied to both an inverter circuit G6 and the AND circuit G8. The output of the inverter circuit G6 is connected to the input of the AND circuit G7.

The outputs of the AND circuits G7 and G8 are connected to the input of a NOR circuit G9, and the output of the NOR circuit G9 is connected to an inverter circuit G10 which outputs the write data WD.

A-3. Operation of Address Scramble Circuit

An operation of the address scramble circuit 8 will be now discussed. During a normal operation, not the burn-in test, the burn-in mode signal BIT is "L", i.e., non-active, and accordingly the output of the NAND circuit GI of the ante-stage circuit shown in FIG. 2, is always "H", i.e., active. One of the outputs of the NAND circuit G2 is connected to the ground potential, being "L", and the output thereof is "H". Accordingly, the output of the negative NAND circuit G3, i.e., the data inversion instructing signal DINV, is always "L". Thus, the data inversion instructing signal DINV keeps "L", i.e., non-active, during the normal operation.

In the post-stage circuit of FIG. 3., since the data inversion instructing signal DINV is "L", the input of the AND circuit G7 is supplied with "H" and the input of the AND circuit G8 is supplied with "L", outputting "L". When the input data INTDQ is "L", the output of the AND circuit G7 becomes "L", the output of the NOR circuit G9 becomes "H", and the output of the inverter circuit G10, i.e., the write data WD, becomes "L". On the other hand, when the input data INTDQ is "H", the output of the AND circuit G7 becomes "H", the output of the NOR circuit G9 becomes "L", and the output of the inverter circuit G10, i.e., the write data WD, becomes "H".

Thus, it is found that during the normal operation, the address scramble circuit 8 outputs the input data INTDQ, without being inverted, as the write data WD, regardless of the row address first signal RAF (0).

During the burn-in test, the burn-in mode signal BIT is "H", i.e., active, and accordingly the output of the NAND circuit G1 of the ante-stage circuit shown in FIG. 2 is an inverted signal of the row address first signal RAF (0). Since the output of the NAND circuit G2 is "H", the output of the negative NAND circuit G3 becomes "L" when the output of the NAND circuit G1 is "H" and the output of the negative NAND circuit G3 becomes "H" when the output of the NAND circuit G1 is "L". Thus, the ante-stage circuit outputs the row address first signal RAF (0), without being changed, as the data inversion instructing signal DINV.

In the post-stage circuit of FIG. 3., when the data inversion instructing signal DINV is "L", i.e., non-active, the same operation as the normal operation is carried out. When the data inversion instructing signal DINV is "H", i.e., active, the input of the AND circuit G7 is supplied with "L", outputting "L", and the input of the AND circuit G8 is supplied with "H".

When the input data INTDQ are "L", the output of the AND circuit G8 becomes "H", the output of the NOR circuit G9 becomes "L", and the output of the inverter circuit G10, i.e., the write data WD, becomes "H". On the other hand, when the input data INTDQ are "H", the output of the AND circuit G8 becomes "L", the output of the NOR circuit G9 becomes "H", and the output of the inverter circuit G10, i.e., the write data WD, becomes "L". Thus, it is found that during the burn-in test, the address scramble circuit 8 outputs the inverted signal of the input data INTDQ as the write data WD when the row address first signal RAF (0) is "H" and outputs the input data INTDQ, without being inverted, as the write data WD when the row address first signal RAF (0) is "L".

A-4. Operation of Semiconductor Memory Device

Figure 4:
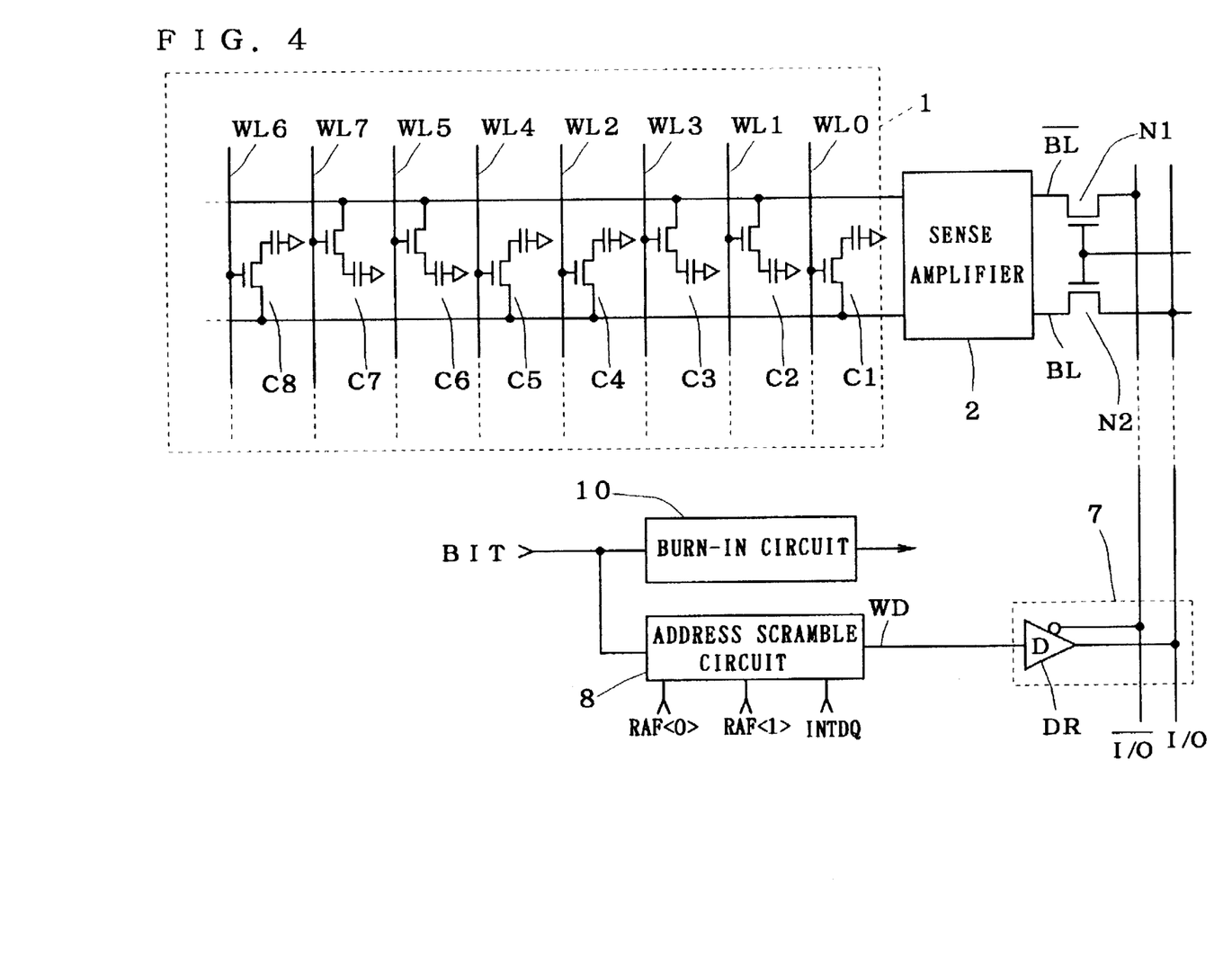
FIG. 4 is a diagram showing an operation of the semiconductor memory device in accordance with the first preferred embodiment of the present invention.

Referring next to FIG. 4, an operation of the semiconductor memory device 100 will be discussed. FIG. 4 shows a configuration of the memory array 1 and a connection between the memory array 1 and the address scramble circuit 8. The bit lines BL and $\overline{BL}$ are connected in parallel to the sense amplifier 2 and word lines WL0 to WL7 are arranged to be orthogonal to the bit lines BL and $\overline{BL}$ in the order of WL0, WL1, WL3, WL2, WL4, WL5, WL7 and WL6 from the sense amplifier 2.

A memory cell C1 includes a capacitor and an NMOS transistor having the drain electrode connected to the bit line BL, the gate electrode connected to the word line WL0 and the source electrode connected to the capacitor. A memory cell C2 includes a capacitor and an NMOS transistor having the drain electrode connected to the bit line $\overline{BL}$, the gate electrode connected to the word line WL1 and the source electrode connected to the capacitor. A memory cell C3 includes a capacitor and an NMOS transistor having the drain electrode connected to the bit line $\overline{BL}$, the gate electrode connected to the word line WL3 and the source electrode connected to the capacitor. A memory cell C4 includes a capacitor and an NMOS transistor having the drain electrode connected to the bit line BL, the gate electrode connected to the word line WL2 and the source electrode connected to the capacitor. A memory cell C5 includes a capacitor and an NMOS transistor having the drain electrode connected to the bit line BL, the gate electrode connected to the word line WL4 and the source electrode connected to the capacitor. A memory cell C6 includes a capacitor and an NMOS transistor having the drain electrode connected to the bit line $\overline{BL}$, the gate electrode connected to the word line WL5 and the source electrode connected to the capacitor. A memory cell C7 includes a capacitor and an NMOS transistor having the drain electrode connected to the bit line $\overline{BL}$ the gate electrode connected to the word line WL7 and the source electrode connected to the capacitor. A memory cell C8 includes a capacitor and an NMOS transistor having the drain electrode connected to the bit line BL, the gate electrode connected to the word line WL6 and the source electrode connected to the capacitor.

The bit line $\overline{BL}$ is connected to the drain electrodes of the memory cells C2, C3, C6 and C7 having the gate electrodes of NMOS transistors connected to the word lines WL1, WL3, WL5 and WL7, respectively. The bit line BL is connected to an input/output line (I/O line) through the sense amplifier 2 and the NMOS transistor N2, and the input/output line is connected to the output of a driver circuit DR. The bit line $\overline{BL}$ is connected to an inversion input/output line ($\overline{I/O}$ line) through the sense amplifier 2 and the NMOS transistor N1, and the inversion input/output line is connected to the inversion output of the driver circuit DR. The data written into the memory cells having the gate electrodes connected to the word lines assigned odd number are inverted ones of the data written into the memory cells having the gate electrodes connected to those assigned even number.

During the burn-in test, all of the memory cells are desirably loaded with either "H" or "L". If any word line of odd number is selected, the input data INTDQ should be inverted and then supplied to the driver circuit DR, and if any word line of even number is selected, the input data INTDQ should be supplied to the driver circuit DR, without being inverted. The address scramble circuit 8 is used therefor.

As discussed above, during the burn-in test, the address scramble circuit 8 outputs the inverted signal of the input INTDQ as write data WD when the row address first signal RAF (0) is "H", and outputs the input data INTDQ without inversion as write data WD when the row address first signal RAF (0) is "L". In other words, the address scramble circuit 8 serves as an input data inverter circuit which inverts the input data in response to the burn-in mode signal BIT. Accordingly, if the word line of odd number is selected, the row address first signal RAF (0) have to be "H".

Figure 5:
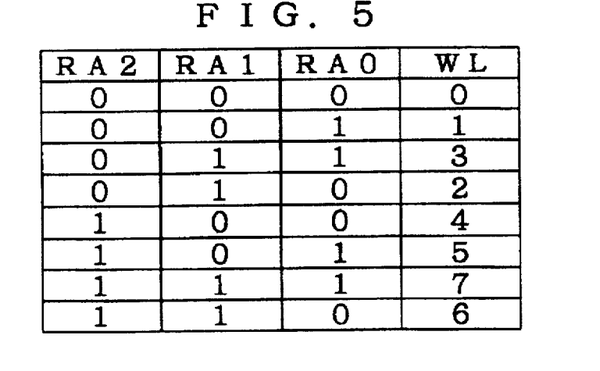
FIG. 5 is a table showing a selection of word lines.

FIG. 5 is a table showing combinations of row address signals for selection of word lines WL0 to WL7. For example, selection of two hundred and fifty-six word lines uses combinations of row address signals RA0 to RA7. Discussion will be presented herein on a case where a combination of row address signals RA0, RA1, RA2 are used for selection of word lines WL0 to WL7.

As can be seen from FIG. 5, if all of the row address signals RA0, RA1 and RA2 are 0 ("L"), the word line WL0 is selected. If RA0 is 1 ("H") and RA1 and RA2 are 0 ("L"), the word line WL1 is selected. If RA0 and RA1 are 1 ("H") and RA2 is 0 ("L"), the word line WL3 is selected. If RA1 is 1 ("H") and RA0 and RA2 are 0 ("L"), the word line WL2 is selected. If RA0 and RA1 are 0 ("L") and RA2 is 1 ("H"), the word line WL4 is selected. If RA0 and RA2 are 1 ("H") and RA1 is 0 ("L"), the word line WL5 is selected. If all of RA0, RA1 and RA2 are 1 ("H"), the word line WL7 is selected. If RA1 and RA2 are 1 ("H") and RA0 is 0 ("L"), the word line WL6 is selected. Thus, when the word lines of odd number WL1, WL3, WL5 and WL7 are selected, the row address signal RA0 is 1. Since the row address first signal RAF (0) is identical to the row address signal RA0, the aforementioned operating condition is satisfied.

Furthermore, another configuration is surely effective, where the word lines of odd number are connected to the bit line BL, instead of the bit line $\overline{BL}$, and the word lines of even number are connected to the bit line $\overline{BL}$, instead of the bit line BL.

A-5. Characterized Function and Effect

Thus, in the semiconductor memory device in accordance with the first preferred embodiment of the present invention, the address scramble circuit 8 which is provided in the ante-stage of the driver circuit DR of the input/output circuit 7 inverts the input data INTDQ and give the inverted data to the driver circuit DR when the word line of odd number is selected during the burn-in test, and gives the input data INTDQ to the driver circuit DR when the word line of even number is selected during the burn-in test. If the input data INTDQ are all the same, all of the memory cells in the memory array 1 can be loaded with the same data as the input data INTDQ. Unlike the background-art semiconductor memory device, the semiconductor memory device of the present invention, which has no necessity of inputting data of complicate pattern, specifically, various data from memory cell to memory cell, simplifies a data input operation and thereby ensures an accurate data input operation even in a case of a simultaneous and parallel test performed for a plurality of semiconductor memory devices. Therefore, an accurate burn-in test can be performed.

A-6. Modification of The First Preferred Embodiment

As discussed above referring to FIG. 4, each memory cell has the NMOS transistor and the capacitor, and the source electrode of NMOS transistor is connected to the capacitor. More exactly, the source electrode of NMOS transistor is connected to a storage electrode, and a cell plate opposed to the storage electrode is connected to a prescribed potential.

The cell plate potential $V_{cp}$ is normally one-half of the source voltage $V_{cc}$. A higher stress is imposed on the capacitor by switching the cell plate potential $V_{cp}$ to the ground potential, i.e., "L", when the capacitor is brought into "H" or to the source voltage $V_{cc}$, i.e., "H", when the capacitor is brought into "L".

Figure 6:
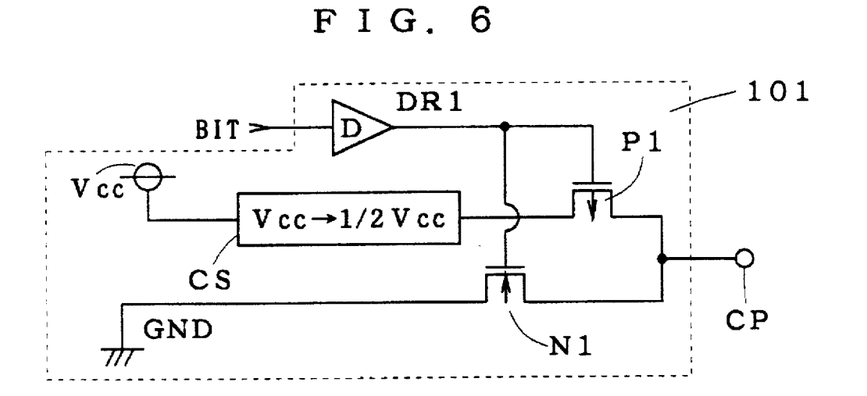
FIG. 6 is a diagram of a configuration of a cell plate potential switching circuit.
Figure 7:
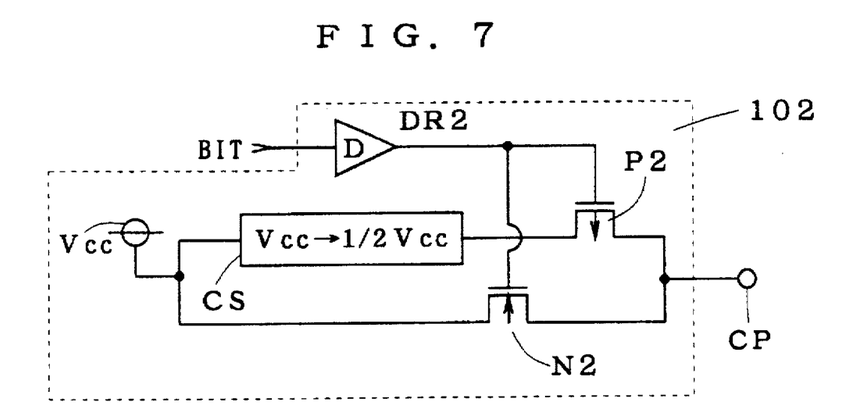
FIG. 7 is a diagram of another configuration of the cell plate potential switching circuit.

Referring to FIGS. 6 and 7, a configuration of the burn-in circuit having the above function will be discussed below.

FIG. 6 shows a configuration of a cell plate potential switching circuit 101 in the burn-in circuit 10, which switches the cell plate potential $V_{cp}$ to the ground potential. In FIG. 6, the output of a cell plate voltage generator circuit CS which generates a normal cell plate voltage on the basis of the source voltage $V_{cc}$ is connected to the source electrode of PMOS transistor P1, and the drain electrode of PMOS transistor P1 is connected to a cell plate CP. The source electrode of NMOS transistor N1 is connected to the ground potential, and the drain electrode thereof is connected to the cell plate CP. The burn-in mode signal BIT is applied to the gate electrodes of PMOS transistor P1 and NMOS transistor N1 through the driver circuit DR1.

In a normal state where the burn-in mode signal BIT is "L", i.e., non-active, the driver circuit DR1 turns the PMOS transistor P1 on to supply the cell plate CP with an output of the cell plate voltage generator circuit CS, ½ $V_{cc}$. During the burn-in test, where the burn-in mode signal BIT is brought into "H", i.e., an active mode, the driver circuit DR1 turns the NMOS transistor N1 on to supply the cell plate CP with the ground potential. FIG. 7 shows a configuration of a cell plate potential switching circuit 102 in the burn-in circuit 10, which switches the cell plate potential $V_{cp}$ to the source voltage $V_{cc}$. In FIG. 7, the output of the cell plate voltage generator circuit CS which generates the normal cell plate voltage on the basis of the source voltage $V_{cc}$ is connected to the source electrode of PMOS transistor P2, and the drain electrode of PMOS transistor P2 is connected to the cell plate CP. The source electrode of NMOS transistor N2 is connected to the ground potential, and the drain electrode thereof is connected to the cell plate CP. The burn-in mode signal BIT is applied to the gate electrodes of PMOS transistor P2 and NMOS transistor N2 through the driver circuit DR2.

In the normal state where the burn-in mode signal BIT is "L", i.e., non-active, the driver circuit DR2 turns the PMOS transistor P2 on to supply the cell plate CP with the output of the cell plate voltage generator circuit CS, ½ $V_{cc}$. During the burn-in test, where the burn-in mode signal BIT is brought into "H", i.e., an active mode, the driver circuit DR2 turns the NMOS transistor N2 on to supply the cell plate CP with the source voltage $V_{cc}$.

B. The Second Preferred Embodiment

B-1. Configuration of Semiconductor Memory Device

Figure 8:
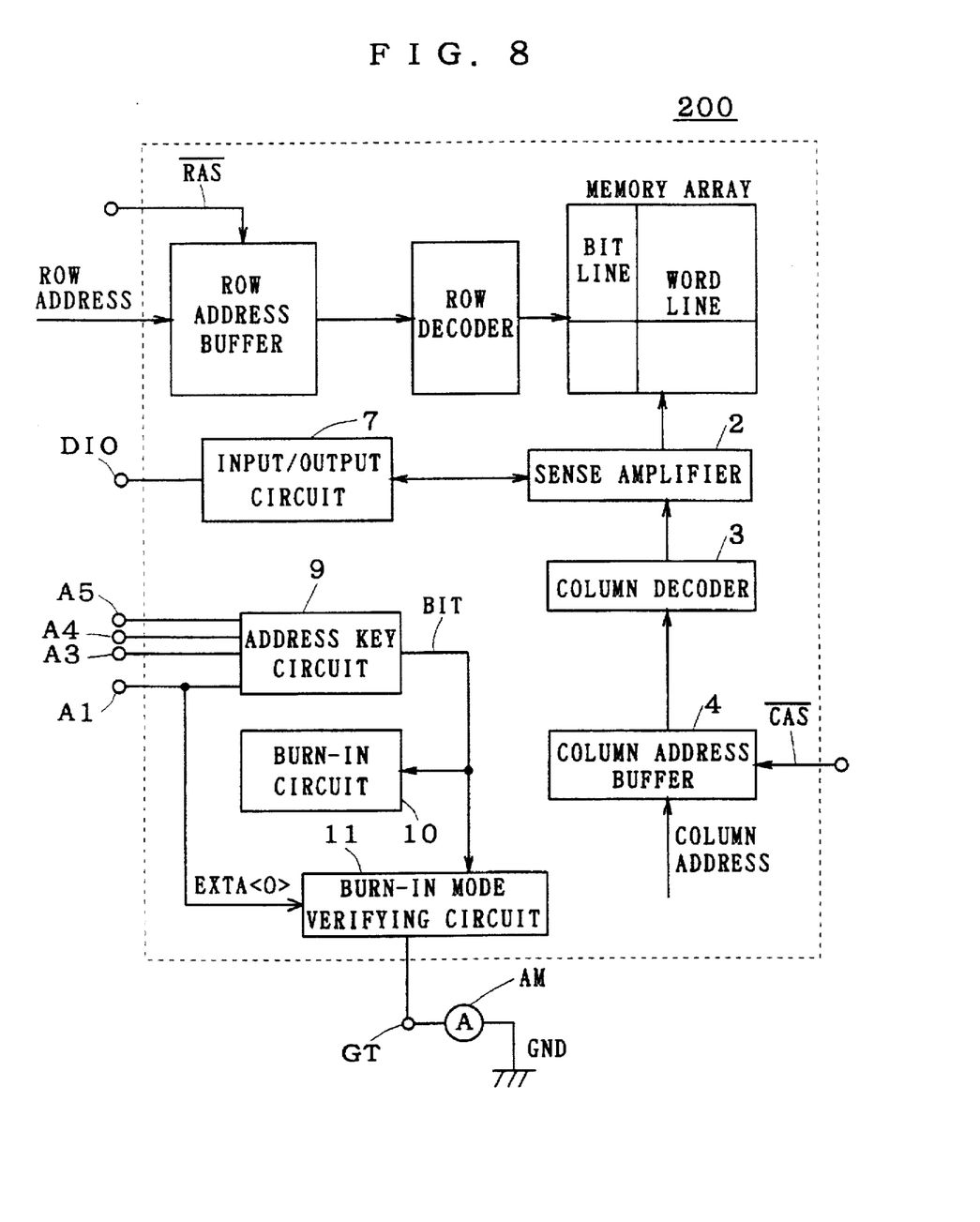
FIG. 8 is a block diagram of a configuration of a semiconductor memory device in accordance with a second preferred embodiment of the present invention.

FIG. 8 is a block diagram of a configuration of a semiconductor memory device 200 in accordance with the second preferred embodiment of the present invention. In FIG. 8, a burn-in mode verifying circuit 11 which receives the burn-in mode signal BIT outputted from the address key circuit 9 and an externally inputted signal EXTA (0) applied to an address input terminal A1 and verifies if the semiconductor memory device is brought into the burn-in mode. The burn-in mode verifying circuit 11 is connected to a ground terminal GT, and an ammeter AM is interposed between the ground terminal GT and the ground potential outside the semiconductor memory device. Like elements are given the same reference numbers as those in the semiconductor memory device 100 of FIG. 1, and duplicate discussion will be omitted.

Among tests for semiconductor devices including the semiconductor memory device, there are an acceleration test and an operating margin test, as well as the burn-in test. In common, any test is performed under a condition different from a normal operating condition, and has its own suitable test environment (referred to as "mode"). Selection of a test mode by receiving a control signal at an unusual timing from an existing terminal or a source voltage higher than a signal of normal "H" level allows various tests to be performed without additional provision of any terminal therefor. Means for selecting the test mode used herein is the address key circuit 9.

B-2. Configuration of Address Key Circuit

Figure 9:
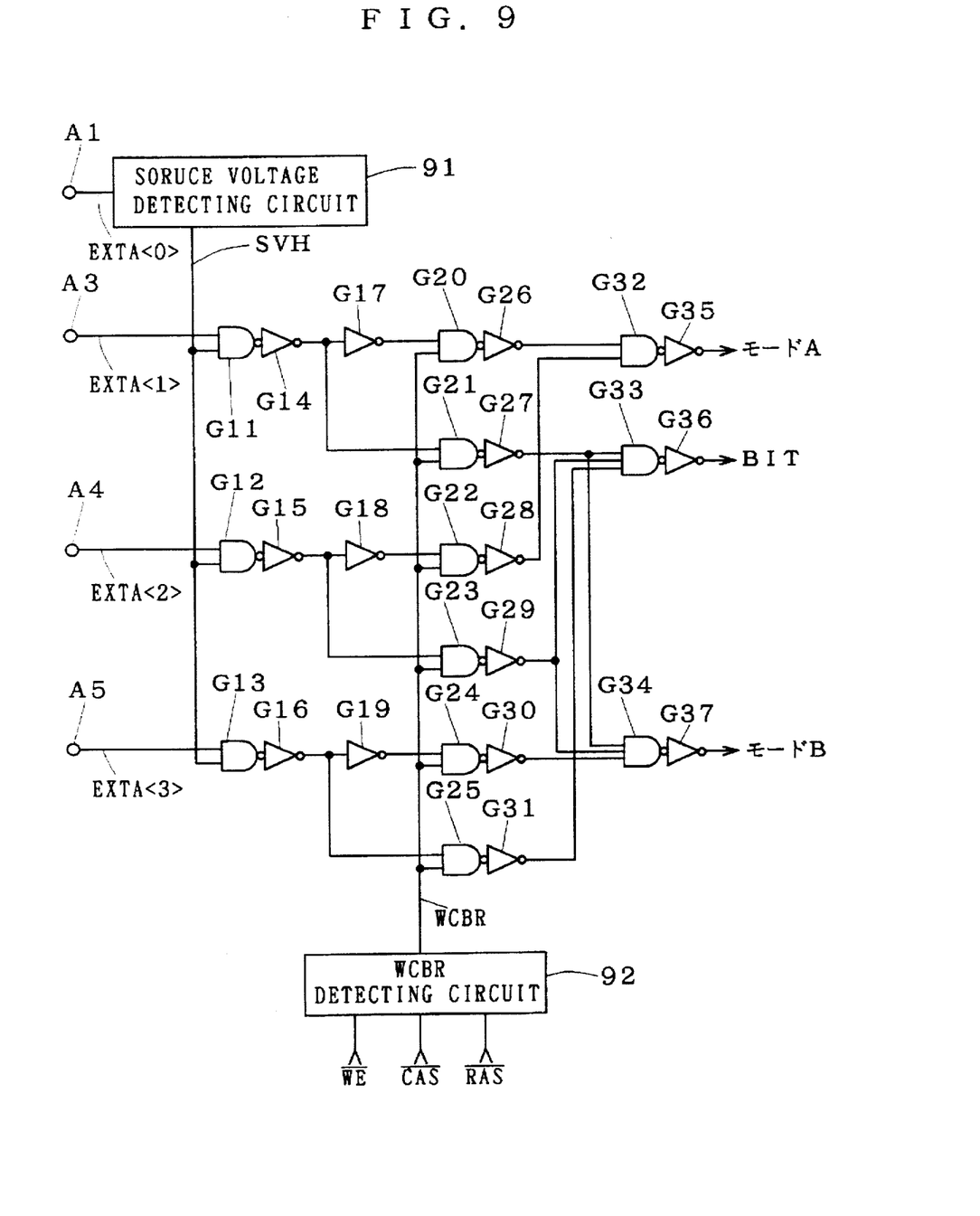
FIG. 9 is a diagram of a configuration of an address key circuit.

FIG. 9 shows a configuration of the address key circuit 9. In FIG. 9, the address input terminal A1 is connected to a source voltage detecting circuit 91. The source voltage detecting circuit 91 detects whether a source voltage higher than a signal of normal "H" level (referred to as "super-Vih" hereinafter) is applied or not, and outputs a voltage detection signal SVH if the super-Vih is applied.

In FIG. 9, a WCBR detecting circuit 92 is further provided, which receives the column address strobe signal (CAS signal) inputted through the column address strobe input terminal, the row address strobe signal (RAS signal) inputted through the row address strobe terminal) and the write enable signal (WE signal) inputted through the write enable input terminal WE and detects whether WCBR (Write CAS Before RAS) state or not, to output a WCBR signal if WCBR state.

As shown in FIG. 9, NAND circuits G11, G12 and G13 which are arranged in parallel have the respective one inputs connected to the address input terminals A3, A4 and A5 and the respective other inputs supplied with the voltage detection signal SVH from the source voltage detecting circuit 91. The outputs of the NAND circuits G11, G12 and G13 are connected to inverter circuits G14, G15 and G16, respectively.

The output of the inverter circuit G14 is connected to the input of an inverter circuit G17 and the one input of a NAND circuit G21, the output of the inverter circuit G15 is connected to the input of an inverter circuit G18 and the one input of a NAND circuit G23, and the output of the inverter circuit G16 is connected to the input of an inverter circuit G19 and the one input of a NAND circuit G25. The outputs of the inverter circuits G17, G18 and G19 are connected to the respective one inputs of the NAND circuits G20, G22 and G24. The respective other inputs of the NAND circuits G20 to G25 are supplied with the WCBR signal from the WCBR detecting circuit 92.

The outputs of the NAND circuits G20 to G25 are connected to the inputs of the inverter circuits G26 to G31, respectively. The outputs of the inverter circuits G26 and G28 are connected to the input of the NAND circuit G32, and the output of the inverter circuit G27 is connected to the inputs of the NAND circuits G33 and G34. The output of the inverter circuit G29 is connected to the inputs of the NAND circuits G33 and G34, and the outputs of the inverter circuits G30 and G31 are connected to the inputs of the NAND circuits G34 and G33, respectively.

The outputs of the NAND circuits G32 to G34 are connected to the inputs of the inverter circuits G35 to G37, respectively. The inverter circuit G35 outputs a mode-A signal for selection of a mode A, the inverter circuit G36 outputs the burn-in mode signal BIT for selection of the burn-in mode, and the inverter circuit G37 outputs a mode-B signal for selection of a mode B.

B-3. Operation of Address Key Circuit

A next discussion will be presented on an operation of the address key circuit 9. In FIG. 9, when the externally inputted signal EXTA (0) from the address input terminal A1 becomes the super-Vih, the voltage detection signal SVH outputted from the source voltage detecting circuit 91 becomes "H" and the respective one inputs of the G11 to G13 become "H". At this time, since the device is in the WCBR state, the WCBR signal outputted from the WCBR detecting circuit 92 becomes "H" and the inputs of the NAND circuits G20 to G25 connected to the WCBR detecting circuit 92 become "H".

In this state, if the externally inputted signals EXTA (1), EXTA (2) and EXTA (3) from the address input terminals A3, A4 and A5 are "H", the outputs of the inverter circuits G27, G29 and G31 become "H" and consequently the output of the inverter circuit G36, i.e., the burn-in mode signal BIT, becomes "H".

At this time, the output of the inverter circuit G35, i.e., the mode-A signal, and the output of the inverter circuit G37, i.e., the mode-B signal, are "L", not selecting the mode A or the mode B. Selection of the mode A or the mode B axises the necessity to change the externally inputted signals EXTA (1), EXTA (2) and EXTA (3) and the voltage detection signal SVH.

Figure 10A:
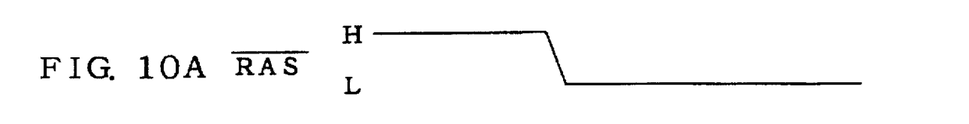
FIG. 10A to FIG. 10F are timing chart showing an operation of the semiconductor memory device in accordance with the second preferred embodiment of the present invention.
Figure 10B:
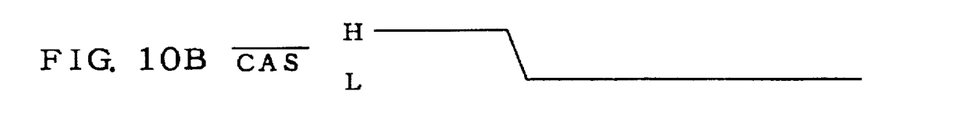
Figure 10C:
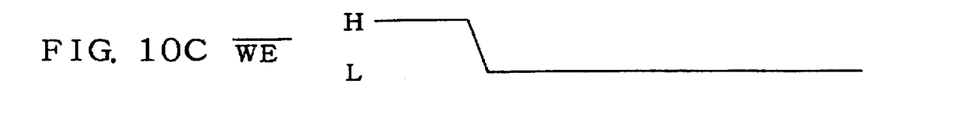

FIG. 10A to FIG. 10F are timing chart showing a rise of the burn-in mode signal BIT. In FIG. 10A, FIG. 10B, and FIG. 10C, the device enters the WCBR state when the RAS signal falls after the WE signal and the CAS signal sequentially fall. The device never enters the WCBR state during a normal memory operation, and accordingly the WCBR state means a state for selecting the test mode, in other words, a state for entering a test mode.

Figure 10D:
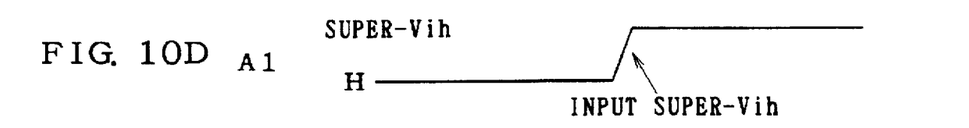
Figure 10E:
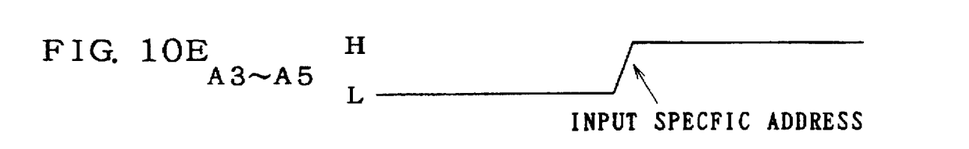
Figure 10F:
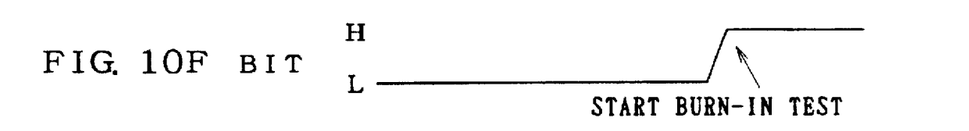

As shown in FIG. 10D to FIG. 10F, when the address signal input terminal A1 is supplied with the super-Vih and the externally inputted signal EXTA (1) to EXTA (3) from the address signal input terminals A3 to A5 rise, the burn-in mode signal BIT rises after a prescribed delay time which is caused by the circuit device.

As discussed above, the semiconductor memory device is brought into the test mode by causing the WCBR state and a desired test mode is selected by supplying address signals to a plurality of address signal input terminals. Thus, various types of tests are carried out with high reliability.

B-4. Configuration of Burn-in Mode Verifying Circuit

Figure 11:
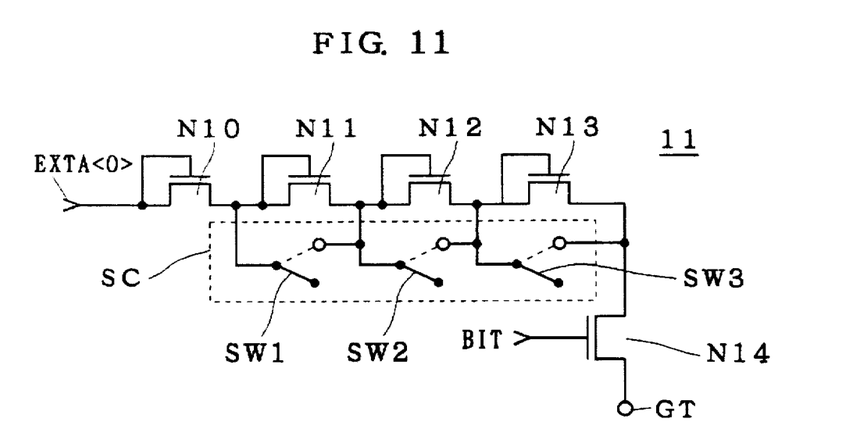
FIG. 11 is a diagram of a configuration of a burn-in mode verifying circuit in accordance with the second preferred embodiment of the present invention.

Next, a configuration of the burn-in mode verifying circuit 11 will be discussed, referring to FIG. 11. In FIG. 11 illustrating an example of the burn-in mode verifying circuit 11, diode-connected NMOS transistors N10 to N13 are connected in series sequentially. The drain electrode of NMOS transistor N10 is supplied with the externally inputted signal EXTA (0). The gate electrode of NMOS transistor N13 is connected in series to the NMOS transistor N14 which receives the burn-in mode signal BIT, and the source electrode of NMOS transistor N14 is connected to the ground terminal GT.

The NMOS transistor N11 is provided with a short-circuit switch SW1 which permits a short circuit between its drain electrode and source electrode. The NMOS transistor N12 is provided with a short-circuit switch SW2 which permits a short circuit between its drain electrode and source electrode. The NMOS transistor N13 is provided with a short-circuit switch SW3 which permits a short circuit between its drain electrode and source electrode. The short-circuit switches SW1, SW2 and SW3 constitute a short circuit SC.

B-5. Operation of Burn-in Mode Verifying Circuit

When the semiconductor memory device enters the burn-in mode, supplied with the super-Vih as the externally inputted signal EXTA (0) and the burn-in mode signal BIT of "H", i.e., active, the NMOS transistor N14 turns on. The NMOS transistors N10 to N13, which are each diode-connected, develop voltage drops by their respective threshold voltages. When the super-Vih excesses the whole dropped voltage across the NMOS transistors, all of the NMOS transistors N10 to N13 turn on, to thereby carry a current through the NMOS transistor N14. The current is termed a leak current. With the ammeter AM interposed between the ground terminal GT and the ground potential as shown in FIG. 8, the leak current is externally measured to achieve an external verification as to whether the device enters the burn-in mode or not.

Furthermore, the ammeter AM may be interposed between the address signal input terminal A1 receiving the externally inputted signal EXTA (0) and a power supply for supplying the super-Vih.

A current flowing in the burn-in mode verifying circuit 11 is larger than a noise current or a dark current and can be obtained through calculation. Accordingly, by checking if the current through the ammeter AM reaches the prescribed value obtained through calculation, it is possible to verify whether the burn-in mode signal BIT of "H" is provided or not, that is, the device enters the burn-in mode or not.

A next discussion will be presented on the function and effect of the short circuit SC. Without the short circuit SC, if the threshold values of the NMOS transistors N10 to N13 are wrongly determined higher than the designed value in a manufacturing process, there arises a possibility that the NMOS transistor N13 may not turn on because greater voltage drop develops across the transistors. In such a case, even if the burn-in mode signal BIT comes into "H", i.e., an active state, no leak current flows.

Then, in any of the NMOS transistors N11 to N13 which has a threshold value out of the designed value, the transistor is short-circuited between its drain and source electrodes by the corresponding one of the short-circuit switches SW1 to SW3 in the short circuit SC, so that the leak current inevitably flows when the burn-in mode signal BIT comes into "H", i.e., an active state.

Furthermore, there is no necessity to use a switching element for the short-circuit switches SW1 to SW3. If an abnormality of any threshold value of the NMOS transistors N11 to N13 is found in a characteristic test of transistors, the transistor in question is short-circuited between its drain and source electrodes by using aluminum wire and the like. An focused Ion Beam (FIB) is used therefor, forming a short-circuit wiring with an aluminum ion beam having a tip diameter of about submicron.

Figure 12:
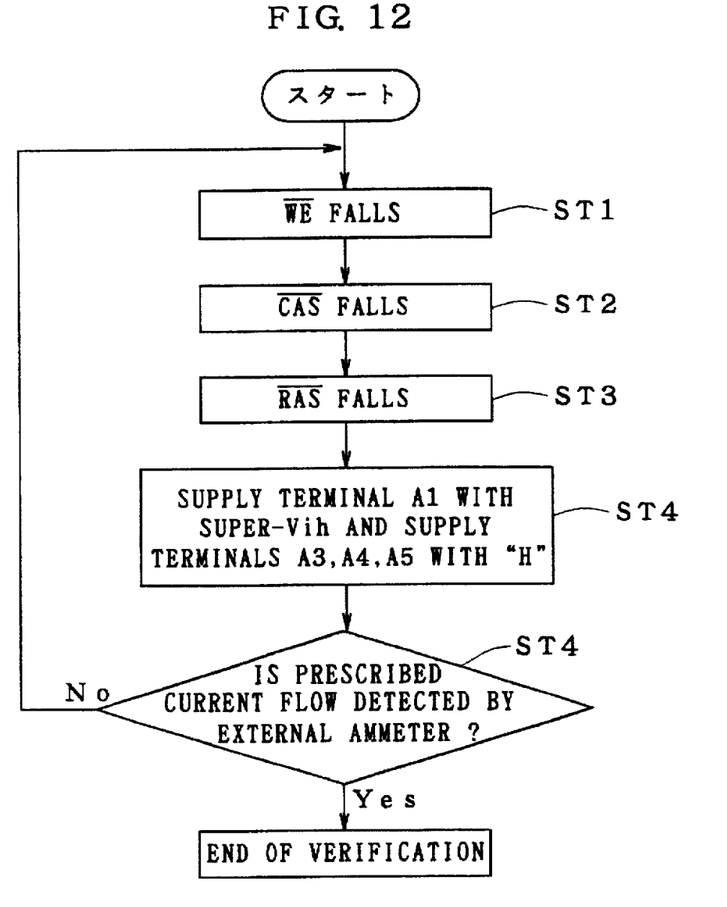
FIG. 12 is a flow chart of an operation of the semiconductor memory device in accordance with the second preferred embodiment of the present invention.

FIG. 12 is a flow chart of the above-discussed operation for verifying the burn-in mode.

First, the $\overline{WE}$ signal is made fallen in a step ST1. In a step ST2, the $\overline{CAS}$ signal is made fallen, and subsequently in a step ST3, the $\overline{RAS}$ signal is made fallen.

In a step ST4, the super-Vih is applied to the address signal input terminal A1 and the signals applied to the address signal input terminals A3, A4 and A5 are brought into "H".

In a step ST5, a check is made as to whether a prescribed current flows through the external ammeter or not.

If a flow of the prescribed current is detected in the step ST5, the verification proves that a normal burn-in test is performed, and is over. Otherwise, the operation goes back to the step ST1 again.

B-6. Characterized Function and Effect

As above discussed, the semiconductor memory device in accordance of the second preferred embodiment of the present invention enters the test mode through the WCBR state and selects the burn-in mode by receiving a plurality of address signals from a plurality of address signal input terminals. Therefore, the burn-in test can be performed with high reliability. Further, since the leak current starts flowing at the point of time when a prescribed address signal input terminal receives the address signal, the power consumption for verification of the burn-in mode can be reduced.

Supplied with the super-Vih for the burn-in test and the burn-in mode signal BIT, the semiconductor memory device, which is provided with the burn-in mode verifying circuit between the power supply for supplying the super-Vih and the ground potential, allows the external verification as to whether the device enters the burn-in mode or not, and eliminates a possibility of missing defective items which would arise if the test is performed out of the burn-in mode.

While the invention has been shown and described in detail, the foregoing description is in all aspects illustrative and not restrictive. It is therefore understood that numerous modifications and variations can be devised without departing from the scope of the invention.

We claim:

1. A semiconductor memory device, comprising:
   input means for supplying a first bit line with a first signal of a first potential which is the equivalent of a potential of input data and supplying a second bit line with a second signal of a second potential which is the reverse of said potential of said input data;

a first memory cell provided on an intersection of said first bit line and a word line of a first type which is a word line assigned either odd number or even number; and a second memory cell provided on an intersection of said second bit line and a word line of a second type opposite to said first type, wherein said first signal is written into said first memory cell when said first bit line and said word line of said first type are selected and said second signal is written into said second memory cell when said second bit line and said word line of said second type are selected, said semiconductor memory device further comprising:

burn-in mode signal output means for outputting a burn-in mode signal which is brought into an active state when a burn-in test is performed; and input data inverting means provided in an ante-stage of said input means to receive said burn-in mode signal, for automatically inverting said input data when said word line of said second type is selected while said burn-in mode signal is active.

2. The semiconductor memory device of claim 1, wherein said input data inverting means includes inversion instructing means for receiving said burn-in mode signal and a row address signal which is applied to a prescribed row address terminal and brought into an active state when said word line of said second type is selected and outputting an inversion instructing signal which is brought into an active state when said burn-in mode signal and said row address signal become active; and signal inverting means for receiving said inversion instructing signal and said input data and inverting said input data which is inputted while said inversion instructing signal is active, to output inverted input data.

3. The semiconductor memory device of claim 2, wherein said inversion instructing means includes a first NAND circuit for receiving said burn-in mode signal and said row address signal; and a first inverter circuit for receiving and inverting an output from said first NAND circuit and then outputting the inverted output of said first NAND circuit, and said signal inverting means includes a second inverter circuit for receiving said input data;

a third inverter circuit connected in series to said second inverter circuit;

a fourth inverter circuit for receiving said inversion instructing signal;

a first AND circuit for receiving outputs from said third and fourth inverter circuits;

a second AND circuit for receiving an output from said second inverter circuit and said inversion instructing signal data;

a NOR circuit for receiving outputs of said first and second AND circuits; and a fifth inverter circuit for receiving and inverting an output from said NOR circuit and then outputting the inverted output of said NOR circuit.

4. The semiconductor memory device of claim 1, further comprising:

cell-plate potential switching means for receiving said burn-in mode signal and switching cell plate potentials of said first and second memory cells to said second potential while said burn-in mode signal is active.

5. The semiconductor memory device of claim 4, wherein said first potential is high potential, and said second potential is low potential.

6. The semiconductor memory device of claim 4, wherein said first potential is low potential, and said second potential is high potential.

7. A semiconductor memory device, comprising:

burn-in mode signal output means for outputting a burn-in mode signal which is brought into an active state in response to a column address strobe signal, a row address strobe signal, a write enable signal and a plurality of address signals inputted from a plurality of address terminals, all of which are supplied at a prescribed timing during a burn-in test, and a source voltage of higher level than a level of a normal high-potential signal which is applied to specific address terminal different from said plurality of address terminals; and burn-in mode verifying means provided between said specific address terminal and a ground potential, for verifying if said semiconductor memory device enters a burn-in mode and carrying a leak current between said specific address terminal and said ground potential in response to said burn-in mode signal at said active state.

8. The semiconductor memory device of claim 7, wherein said burn-in mode verifying means includes a first transistor having an electrode which is connected to said specific address terminal and also connected to its own control electrode to establish a diode connection;

a plurality of second transistors each establishing a diode connection and connected in series to said first transistor; and a third transistor interposed between the last one of said second transistors and said ground potential, having a control electrode connected to said burn-in mode signal output means.

9. The semiconductor memory device of claim 8, wherein said plurality of second transistors each include short-circuit means provided in parallel between one electrode and the other electrode thereof, for establishing a short-circuit connection between said one electrode and said other electrode under a prescribed condition.

10. The semiconductor memory device of claim 7, wherein said burn-in mode signal output means includes source voltage detecting means for detecting whether said source voltage of higher level than the level of said normal high-potential signal is applied or not and outputting a voltage detection signal which is brought into an active state when said source voltage of higher level than the level of said normal high-potential signal is applied;

write column address strobe before row address strobe (WCBR) detecting means for outputting a WCBR detection signal which is brought into an active state when said row address strobe signal falls after said write enable signal and said column address strobe signal fall; and mode selecting means for rendering said burn-in mode signal active or non-active depending on a combination of said plurality of address signals, said voltage detection signal and WCBR detection signal.

* * * * *